(12) United States Patent
Koduri

(10) Patent No.: US 9,305,871 B2
(45) Date of Patent: Apr. 5, 2016

(54) HIGH PIN COUNT, SMALL PACKAGES HAVING HEAT-DISSIPATING PAD

(71) Applicant: Texas Instruments Incorporated, Dallas, TX (US)

(72) Inventor: Sreenivasan K. Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/692,283

(22) Filed: Apr. 21, 2015

(65) Prior Publication Data

US 2015/0228566 A1 Aug. 13, 2015

Related U.S. Application Data

(60) Continuation of application No. 14/451,979, filed on Aug. 5, 2014, now Pat. No. 9,013,032, which is a division of application No. 13/353,431, filed on Jan. 19, 2012, now Pat. No. 8,836,107.

(60) Provisional application No. 61/446,316, filed on Feb. 24, 2011.

(51) Int. Cl.
| | |
|---|---|
| H01L 23/495 | (2006.01) |
| H01L 23/34 | (2006.01) |
| H05K 1/02 | (2006.01) |
| H05K 1/11 | (2006.01) |
| H01L 23/31 | (2006.01) |
| H01L 23/367 | (2006.01) |
| H01L 23/482 | (2006.01) |

(52) U.S. Cl.
CPC ...... *H01L 23/49568* (2013.01); *H01L 23/3114* (2013.01); *H01L 23/34* (2013.01); *H01L 23/3677* (2013.01); *H01L 23/4822* (2013.01); *H01L 23/49506* (2013.01); *H01L 23/49517* (2013.01); *H01L 23/49541* (2013.01); *H05K 1/0203* (2013.01); *H05K 1/11* (2013.01); *H05K 1/111* (2013.01); *H01L 2924/0002* (2013.01); *H05K 2201/10636* (2013.01)

(58) Field of Classification Search
CPC .................................................. H01L 23/49541
USPC .................. 257/675, 697, E33.031, E33.066
See application file for complete search history.

(56) References Cited

U.S. PATENT DOCUMENTS

| | | | | |
|---|---|---|---|---|
| 6,437,429 | B1 * | 8/2002 | Su et al. .......................... | 257/666 |
| 2006/0186529 | A1 * | 8/2006 | Shirasaka et al. .............. | 257/690 |
| 2009/0039486 | A1 * | 2/2009 | Shimazaki et al. ............. | 257/676 |
| 2010/0171201 | A1 * | 7/2010 | Wyant et al. ................... | 257/676 |

* cited by examiner

*Primary Examiner* — Long K Tran
(74) *Attorney, Agent, or Firm* — Steven A. Shaw; Frank D. Cimino

(57) ABSTRACT

A plastic package for high power has a pair of oblong metal pins exposed from a surface of the plastic, the pins straddling a corner of the package; each pin has a long axis, the long axes of the pair forming a non-orthogonal angle. Package further includes a chip assembly pad, acting as a thermal spreader and semiconductor chip.

12 Claims, 3 Drawing Sheets

HIGH PIN COUNT, SMALL PACKAGES HAVING HEAT-DISSIPATING PAD

CROSS REFERENCE TO RELATED APPLICATIONS

This application is a Continuation and claims priority to U.S. patent application Ser. No. 14/451,979; filed on Aug. 5, 2014—now U.S. Pat. No. 9,013,032 granted on Apr. 21, 2015. Said application is a Divisional of and claims priority to U.S. patent application Ser. No. 13/353,431; filed on Jan. 19, 2012—now U.S. Pat. No. 8,836,107 granted on Sep. 16, 2014, which in turn claims priority to U.S. Provisional Application 61/446,316 filed Feb. 24, 2011. Said applications are hereby incorporated by reference herein in its entirety

FIELD

Embodiments of the invention are related in general to the field of semiconductor devices and processes, and more specifically to structures and fabrication method of small SON/QFN packages having high lead count and a metal pad for dissipating heat.

DESCRIPTION OF RELATED ART

Plastic packages for semiconductor chips of many logic and analog integrated circuit families are often being manufactured with pins arranged in the so-called Small Outline No-lead (SON) or Quad Flat No-lead (QFN) configuration. In these product categories, the packages do not have the traditional cantilevered metal leads, or pointed pins; instead, they have metallic terminals with surfaces flat with the surrounding plastic material so that these terminals can be conveniently connected (for instance by soldering) to contact pads of printed circuit boards (PCBs). The trend of the SON/QFN technology is for shrinking the size of the packages.

Small SON/QFN package designs are constrained by the footprint of the package, the number of pins, and the process limitations as reflected by the layout rules of the leadframe. Leadframes in most SON/QFN packages have rectangle-shaped leads arranged in parallel along the four edges of the package, with one short side of the rectangle near the package edge and the long sides running between the edge and the center. Each lead has some portions of its perimeter half-etched in order to create locks for solid anchoring of the lead in the molding compound. If a chip pad can be accommodated, it usually has a rectangular shape with the four edges parallel to the four edges of the package. The polymeric compound of the plastic packages leave one surface of each lead exposed from the encapsulation for connection to the PCB.

For many applications, such as handheld telephones, portable appliances, cameras, and medical equipments, the scaling of the SON/QFN packages reached an area of only 1 mm by 1 mm. One recently introduced SON/QFN package of this small size features a design with four leads shaped as triangles situated at the four corner locations and a chip pad with edges oriented at 45° with respect to the package edges. The chip pad doubles as thermal pad to spread the operational heat. Another recently introduced SON/QFN product of 1 mm by 1 mm area has six leads with the conventional rectangular shape arranged parallel along two opposite edges of the package. In this product, each lead has a mold lock, which is formed as a half-etched extension of the lead; the extension is formed along the center line of the lead towards the package center. Near the package center, the mold locks of the leads positioned along one edge of the package come close to the mold locks of the respective leads positioned along the opposite package edge. As a consequence, the half-etched mold locks do not leave space for a chip pad; the chip is assembled on the half-etched lead mold locks by an electrically and thermally insulating layer of adhesive polymeric compound. In spite of the lack of chip pad and thus thermal pad, this product can handle power up to about 0.5 W.

SUMMARY OF THE INVENTION

Analyzing the general market trend for small plastic SON/QFN packages, such as packages with an area of 1 mm by 1 mm or less, applicant found that the product applications call for packages with six terminals and power handling of at least 1 W. For logic and analog products, the semiconductor chips can be expected to have an area of at least 0.3 mm$^2$. Applicant realized that a power of 1 W or more requires a thermal pad, which can spread the operational heat, cool the junctions, and transfer the thermal energy to a heat sink.

Investigating potential structures of 1 mm by 1 mm SON/QFN packages suitable for at least 1 W power, applicant discovered that for 6-terminal packages the requirement for a large thermal pad can be satisfied for chips with an area of 0.3 mm$^2$ or more and widely different chip outlines (the aspect ratio of long and short edges), when the structure of the six terminals is coordinated with the chip edge outlines. In an exemplary embodiment, where chips of about 0.3 mm$^2$ area have an elongated outline with an edge aspect ratio of about 3:1, as in Logic products, the preferred package terminal arrangement may be different from another exemplary embodiment, where chips of about 0.3 mm$^2$ area have a more compact outline with an edge aspect ratio of about 3:2, as in Analog products.

For elongated chips, the space needed for a thermal pad embedded in the 1 mm by 1 mm area of the package can be created by grouping the six rectangle-shaped terminals in two sets of three terminals and aligning the sets along two opposite package edges. Each terminal has a long axis and a mold lock protruding from the terminal, wherein the lock is shaped as an elongated beam oriented normal to the long axis. The beam of a terminal is interdigitated with a beam of an adjacent terminal. Preferably, two terminals of each set are placed in the package corners to maximize the space between terminals and their mold locks.

For compact chips, the space needed for a thermal pad embedded in the 1 mm by 1 mm area of the package can be created by placing the terminals in the corners of the package and forming pairs of terminals straddling a corner; the terminals of these pairs may have oblong shape with the long axes forming a non-orthogonal angle. Preferably, the terminals of these pairs have trapezoidal shape and straddle a corner of the package. Each terminal has a long side and a parallel short side, a third end side distal from the corner, and a fourth side forming an obtuse angle with the short side and an acute angle with the long side; the long sides of the terminal pair are adjacent to each other. The package has a chip assembly pad, which acts as the thermal spreader. The third end sides of the terminal pair are adjacent and parallel to an edge of the thermal pad.

DETAILED DESCRIPTION OF THE PREFERRED EMBODIMENTS

Figure 1:
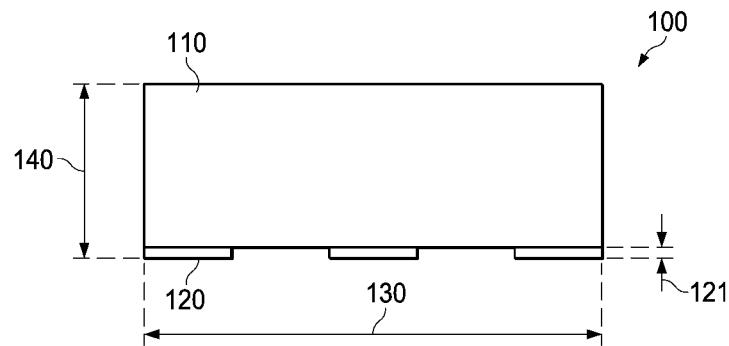
FIG. 1 is a side view of a miniature plastic small outline no-lead/quad flat no-lead (SON/QFN) package.
Figure 2:
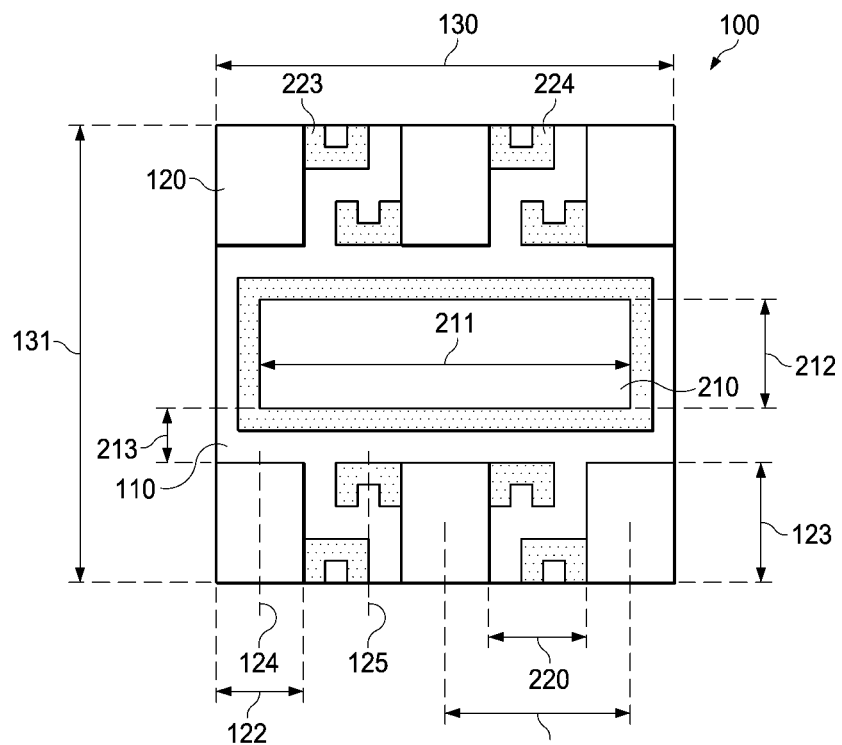
FIG. 2 shows a bottom view of an embodiment of a miniature plastic SON/QFN package with six metal pins and a metal pad for dissipating thermal energy; the pad is especially suitable for assembling chips with elongated outline.

FIG. 1 illustrates a side view and FIG. 2 a bottom view of an exemplary embodiment of a miniature package generally designated 100. The package is encapsulated in a plastic polymeric material 110. The embodiment is classified as a plastic Small Outline No-lead (SON) package, frequently also called a Quad Flat No-lead (QFN) package. The expression No-lead refers to the feature that the package terminals are not conventional cantilevered leads, but flat metal pins 120.

It should be noted that herein, following widespread usage, package terminals 120 are referred to as pins, in spite of the fact that they have a flat surface and do not resemble pointed objects such as nails. When a leadframe is used for an embodiment to assemble a semiconductor chip on the leadframe pad and connect the chip input/output terminals to the leadframe leads, those leads are herein also referred to as pins.

The metal pins may be coplanar with the surrounding plastic surface, or they may protrude a step 121 of about 0.05 mm from the plastic surface as shown in FIG. 1. In the examples of FIGS. 1 and 2, package 100 serves as a housing for semiconductor chips of the Logic and Analog device families. Inside the plastic encapsulation, yet not shown in FIG. 1, the semiconductor chip is assembled on a metallic leadframe with the chip input/output pads wire bonded to the package terminals. In the exemplary embodiment, the width 130 of package 100 is 1.0 mm and the thickness 140 is in the range from 0.34 to 0.40 mm.

FIG. 2 indicates that sides 130 and 131 of the exemplary package 100 have equal length so that package 100 is square-shaped; in exemplary package 100 sides 130 and 131 are both 1.0 mm. Exposed from the surface of plastic material 110 of package 100 are six metal pins 120 and a metal pad 210 for assembling a semiconductor chip and serving as heat spreader. In the example of FIG. 2, the pins are grouped in two sets of three pins each. The pins of each set are arrayed, adjacent to each other, along an edge of the package so that the package corners are occupied by a pin. In order to equalize the distance between adjacent pins, the third pin of a set is preferably at mid-distance between the corner pins. As FIG. 2 shows, the two sets of pins are arrayed along opposite package edges.

In the example of FIG. 2, pins 120 have identical area and identical aspect ratios of their sides. In other embodiments, the pins may have different areas; they may also have different aspect ratios of their sides. While pins 120 are shown as having rectangular or square outline, in other embodiments the outline may be more general. In FIG. 2, width 122 of a pin 120 is in the range from about 0.14 to 0.20 mm, and is preferably about 0.20 mm. For a width of 0.20 mm, the space 220 between two adjacent pins is 0.20 mm, and the pin pitch 221 center-to-center is 0.40 mm. Compared to the conventional pin pitch center-to-center of 0.35 mm, pin pitch 221 is generous and thus supports efforts to increase board assembly yield. The space 220 separating adjacent leads has a center line 125.

The length of a pin is the linear dimension normal to the edge of the [package. Length 123 of a pin 120 is in the range from about 0.20 to 0.30 mm, dependent on the package area to be reserved for metal pad 210. For some embodiments belonging to the Logic product families, length 123 is preferably 0.20 mm in order to reserve maximum area for pad 210. In the direction normal to the package edge, a center line, or axis, 124 can be attributed to each pin 120.

As FIG. 2 illustrates, attached to each pin 120 is at least one metallic mold lock 223. A mold lock stabilizes the pin to which it is attached so that the pin cannot move in x-, y-, or z-direction; consequently, the pin is locked in all three dimensions. The outline of a mold lock is designed to prevent pin movements in the x- and y-dimensions; for preventing a movement in the z-direction, the metal sheet is locally thinned by partial etching so that molding compound can cover the lock area during the encapsulation process; the hardened compound inhibits a pin movement in the z-direction. Partially etched leadframe portions, such as the mold locks, are commonly referred to as half-etched leadframe portions. The half-etched mold locks 223 are hidden under the molding compound 110 and are thus depicted by dashed outlines.

As a preferred design, FIG. 2 illustrates mold locks 223 shaped as elongated beams oriented normal to the pin axis; furthermore, each beam is interdigitated with a beam of an adjacent pin. Interdigitated beams are defined herein as beams protruding from adjacent pins and reaching to the center line 125 of the space separating adjacent pins; preferably, a beam reaches across the center line 125. In preferred lock designs, a beam 223 protrudes from pin 120 at normal angle from the pin axis 124. Each beam-like mold lock may exhibit hook-like features 224 for locking against pin displacements in x- and y-directions. With interdigitated beam-like mold locks 223 providing strong locking for pins 120, there is no need for additional half-etched mold locks shaped as frames for pin widths 122, as they are frequently employed in conventional technology towards the center of the package area.

The space thus freed up in the center portion of the package area is used to accommodate metal pad 210, operable for assembling a semiconductor chip on the inside of the package, and for spreading operational heat from the chip into the PCB outside of the package. In the exemplary embodiment of FIG. 2, length 211 of the pad 210 portion exposed from the plastic 110 measures approximately 0.75 mm, and width 212 of the pad 210 portion exposed from the plastic 110 measures about 0.2 mm. A metal pad with an area between 0.15 and 0.25 mm$^2$ can handle a power of 1 W and spread the operational heat, cool the chip junctions, and transfer the thermal energy to a heat sink in the PCB.

As FIG. 2 indicates, pad 210 also includes a frame of half-etched metal surrounding the exposed metal portion in order to create mold locks for the pad. The width of the half-etched frame is between 0.06 and 0.08 mm, leaving a width between about 0.05 and 0.07 mm for the encapsulation compound. Since the metal pad inside the package available for attaching a semiconductor chip can make full use of the whole pad (exposed and half-etched portions), pad 210 is well suited to be the assembly pad for chips of the Logic and related product families. Chips of these product families have an area of approximately 0.3 mm² and an edge aspect ratio of about 3:1. In the example of FIG. 2, the distance 213 between the exposed metal of a pin 120 and pad 211 is about 0.2 mm, a safe distance for preventing failure by solder shorting during PCB attachment.

Figure 3:
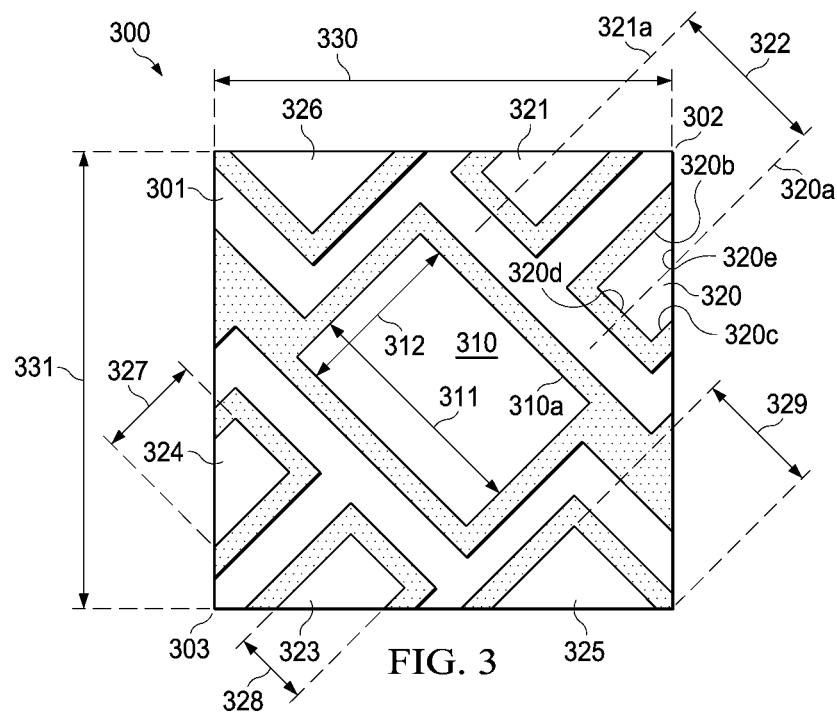
FIG. 3 illustrates a bottom view of another embodiment of a miniature plastic SON/QFN package with six metal pins and a metal pad for dissipating thermal energy; the pad is especially suitable for assembling chips with compact outline; a pair of oblong metal pins is straddling a package corner.

Illustrating another exemplary embodiment, generally designated 300, FIG. 3 shows the bottom view of a miniature package encapsulated in a plastic polymeric material 301. The embodiment is classified as a plastic SON/QFN package, with terminals shaped as flat metal pins, preferably coplanar with the surrounding plastic surface. The package has a thickness between about 0.3 and 0.4 mm. Inside the plastic encapsulation, yet not shown in FIG. 3, a semiconductor chip is assembled on a metallic leadframe with the chip input/output pads wire bonded to the package terminals. Outside the plastic encapsulation, the chip assembly pad has a surface 310 exposed from the surface of the plastic compound 301; this exposed surface has a length 311 between about 0.50 and 0.54 mm, preferably 0.52 mm, and a width 312 between about 0.370 and 0.380 mm, preferably 0.374 mm. A metal pad with an area between 0.15 and 0.25 mm² can handle a power of 1 W and spread the operational heat, cool the chip junctions, and transfer the thermal energy to a heat sink in the PCB.

In addition, pad portions of a width between about 0.06 and 0.08 mm are half-etched for creating mold locks for pad 310. Since the metal pad inside the package available for attaching a semiconductor chip can make full use of the whole pad (exposed and half-etched portions), pad 310 is well suited to be the assembly pad for chips of the Analog and related product families. Chips of these product families have an area of approximately 0.3 mm² and an edge aspect ratio of about 3:2.

FIG. 3 indicates that sides 330 and 331 of the exemplary package 300 have equal length so that package 300 is square-shaped; in the exemplary package 300, sides 330 and 131 are both 1.0 mm. Exposed from the surface of plastic material 301 of package 300 are six metal pins and the metal pad 310; the exposure allows pad 310 to serve as heat spreader. The metal pins and the metal pad have half-etched metal portions serving as mold locks; since these half-etched portions are hidden under plastic compound 301, they are shaded in FIG. 3.

The package of exemplary embodiment of FIG. 3 exhibits a pair of oblong metal pins 320 and 321, which is positioned to straddle a corner 302 of the package. In the opposite package corner 303 is an analogous pair of oblong metal pins straddling that corner. Each pin has a long axis; for pin 320, the long axis is designated 320a, for pin 321, the long axis is designated 321a. The long axes of a pin pair form a non-orthogonal angle; in the embodiment of FIG. 3, the angle is zero, which means, long axes 320a and 321a are parallel to each other. In FIG. 3, the pitch 322 of the long axes, which is the pitch of pins 320 and 321 center-to-center, is 0.35 mm; consequently, it today's design rules for pin pitch are satisfied.

In FIG. 3, the oblong pins 320 and 321 forming a pair and straddling a corner may have the shape of trapezoids. Considering the metal areas exposed from the plastic compound, each pin, for example pin 320, has a long side 320b and a parallel short side 320c; further it has a third end side 320d, which is distal from corner 302, and a fourth side 320e that forms an obtuse angle with respect to short side 320c and an acute angle with respect to long side 320b. The long sides (such as 320b) of the pin pair may be adjacent to each other, and the third end sides (such as 320d) of the pin pair may be adjacent to and parallel with an edge 310a of chip pad 310.

The exemplary package of FIG. 3 has a second pair of pins (323 and 324) that is placed near second corner 303 diagonal to the first corner 302. The second pair of pins is symmetrical to the first pair (320 and 321) of pins with respect to the center point of the package surface. Alternatively, in other embodiments these placement and symmetry arrangements for pins and pad may be more random in order to exactly conform with customized chip and PCB layouts.

The exemplary package of FIG. 3 has a fifth pin 325 and a sixth pin 326. The may have isosceles triangular shape and may be placed near or into the remaining two corners of the package. In FIG. 3, the base of the triangle is placed parallel to an edge of the package. In other embodiments (see for instance FIGS. 4 and 5), the apex of each triangular pin is placed adjacent to on of the two remaining corners of the package.

FIG. 3 displays a plurality of dimensions of exposed metal objects within the guidelines of presently accepted 0.35 mm pitch design rules, which require the spacing between two metallic 0.17 mm pins to be no less than 0.18 mm. Long sides 320b of the trapezoidal pins have a length 327 of about 0.35 mm; third end sides 320d of the trapezoidal pins have a length 328 of about 0.17 mm; and the equal sides of the isosceles triangles 325 and 326 have a length 329 between about 0.25 and 0.26 mm, preferably 0.254 mm. These exposed metal objects are framed by mold locks between 0.06 and 0.08 mm wide and hidden under the encapsulation compound; the mold lock portions are shaded in FIG. 3.

Figure 4:
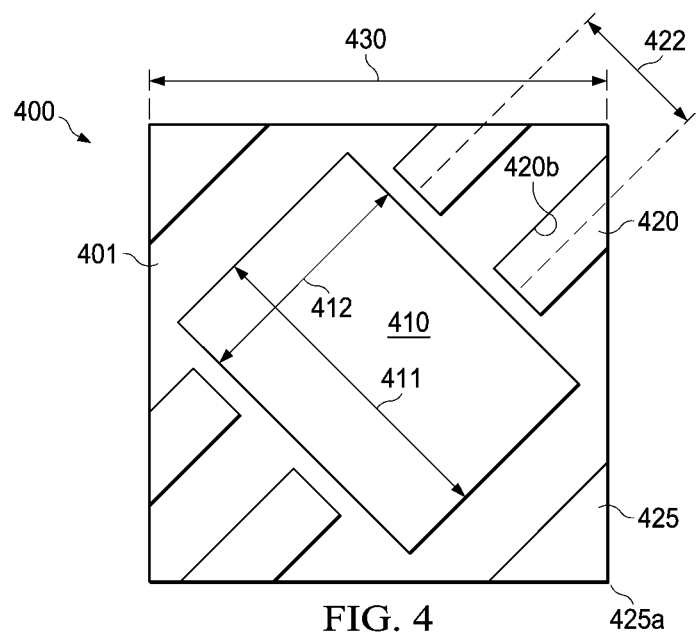
FIG. 4 depicts a bottom view of yet another embodiment of a miniature plastic SON/QFN package with six metal pins and a metal pad for dissipating thermal energy; the pad is especially suitable for assembling chips with compact outline; a pair of oblong metal pins is straddling a package corner.

Another embodiment of a square-shaped 1 mm by 1 mm plastic SON/QFN package, suitable for a power of at least 1 W and for chips with an edge aspect ratios of approximately 3:2, and designed for six pins, is shown in FIG. 4. Package side length 430 is 1.00 mm. The bottom view illustrates that the package, generally designated 400, has a large thermal pad 410 (length 411 exposed from polymeric encapsulation compound 401 is about 0.725 mm and width 412 is about 0.50 mm) operable for assembling a semiconductor chip on the inside of the package, and for spreading operational heat from the chip into the PCB outside of the package. Metal pad 410 with an area of more than 0.36 mm² can handle a power of 1 W and spread the operational heat, cool the chip junctions, and transfer the thermal energy to a heat sink in the PCB.

In this example, two pairs of trapezoidal-shaped pins 420 straddle diagonally opposed package corners, similar to the package of FIG. 3. The long sides 420b of the trapezoidal pins are parallel to each other so that the design rule of 0.35 mm for the pin pitch 422 center-to-center is satisfied, with the pins being 0.18 mm wide and the spacing between the pins being no less than 0.17 mm. The fifth and sixth pins are shaped as isosceles triangles 425; the apex 425a of each triangular pin is placed adjacent to one of the two remaining corners of the package.

As a more general alternative to the trapezoidal shape of the pins in FIG. 4, a plastic SON/QFN package may have a pair of oblong metal pins exposed from a surface of the plastic, wherein the pins straddle a corner of the package. Each pin has a long axis, and the axes of the pair form a non-orthogonal angle.

In the preferred embodiment, the leadframe features (pad, pins) are half-etched to form mold locks for enhancing adhesion between the encapsulation compound and pad and pins, analogous to FIG. 3. With half-etched mold locks, the exposed side of the pins and of the chip pad shown in FIG. 4 may have different surface shapes and a smaller surface area compared to the corresponding opposite side. The smaller surface areas on the exposed side of the package may facilitate more flexible PCB trace placement.

With six pins and a chip pad, the packaged semiconductor device may have six input/output and power pins; furthermore, the backside of the semiconductor chip may be additionally biased to a separate voltage during operation. This capability offers flexibility to device applications. Generally, it is preferable that the size of the chip pad is larger than the size of the semiconductor chip that is affixed to it. One reason for this preference is that it eliminates the potential shorting of the chip to any of the pins. Another reason is that overhanging the chip over the edges of the chip pad will cause stress on the chip during temperature excursion, which may degrade the device performance with the possibility of chip cracking at extreme operating conditions.

Figure 5:
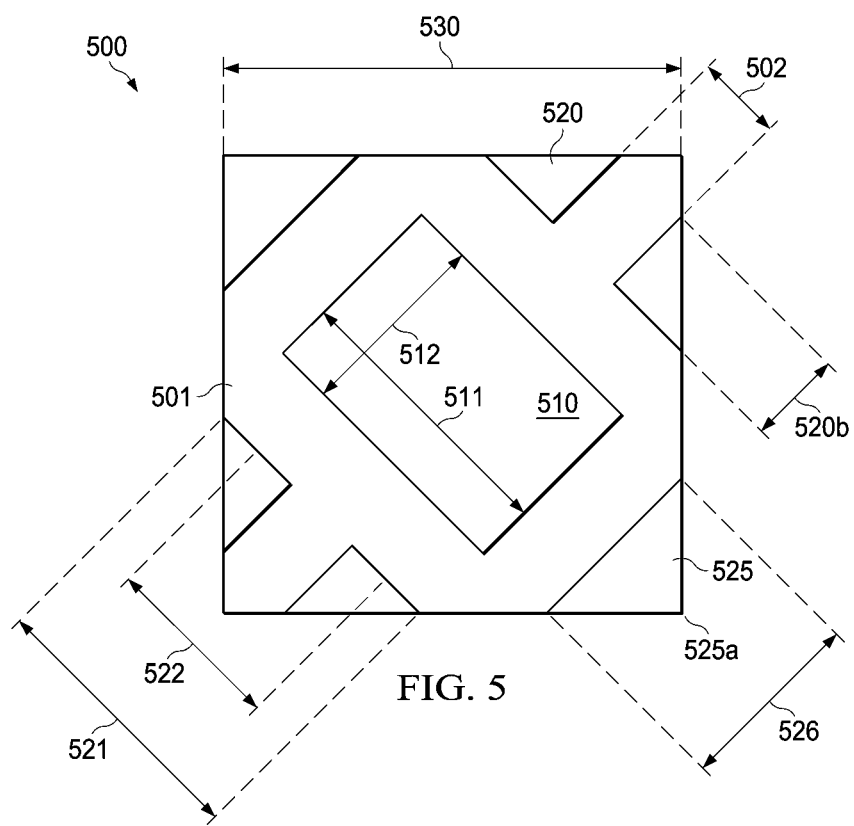
FIG. 5 shows a bottom view of yet another embodiment of a miniature plastic SON/QFN package with six metal pins and a metal pad for dissipating thermal energy; the pad is especially suitable for assembling chips with compact outline; a pair of metal pins is straddling a package corner.

Yet another embodiment of a square-shaped 1 mm by 1 mm plastic SON/QFN package is illustrated in FIG. 5, wherein the package is suitable for a power of at least 1 W and for chips with an edge aspect ratios of approximately 3:2 and designed for six pins. Package side length 530 is 1.00 mm. The bottom view illustrates that the package, generally designated 500, exposes a large thermal pad 510 (length 511 exposed from polymeric encapsulation compound 501 is about 0.62 mm and width 512 is about 0.43 mm) operable for assembling a semiconductor chip on the inside of the package, and for spreading operational heat from the chip into the PCB outside of the package. Metal pad 510 with an area of more than 0.27 mm$^2$ can handle a power of 1 W and spread the operational heat, cool the chip junctions, and transfer the thermal energy to a heat sink in the PCB.

In exemplary embodiment 500, two pairs of pins 520 straddle diagonally opposed package corners. Pins 520 have the shape of isosceles triangles with a side length 520b measuring about 0.20 mm. Sides 520b of the pins are parallel to each other and are separated by a space 502 of about 0.20 mm, so that the design rule of 0.35 mm for the pin pitch 522 center-to-center is satisfied. With the geometries quoted, the distance 521 is about 0.60 mm. The fifth and sixth pins are shaped as isosceles triangles 525; the apex 525a of each triangular pin is placed adjacent to one of the two remaining corners of the package. The long side 526 of isosceles triangle 525 is about 0.4 mm.

Alternatively, plastic SON/QFN packages may have a pair of metal pins exposed from a surface of the plastic so that the pins straddle a corner of the package; in addition, each pin has an axis so that the axes of the pin pair straddle the corner and form a non-orthogonal angle.

It is preferred that the leadframe features (pad, pins) of the embodiment depicted in FIG. 5 are half-etched to form mold locks for enhancing adhesion between the encapsulation compound and pad and pins, analogous to FIG. 3. With half-etched mold locks, the exposed side of the pins and of the chip pad shown in FIG. 4 may have different surface shapes and a smaller surface area compared to the corresponding opposite side.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies not only to SON/QFN packages with side lengths of 1 by 1 mm, but to packages with scaled dimensions, especially to packages with smaller side lengths.

As another example, the concept of a small plastic SON/QFN package with six pins and a thermal pad for high power operation can be applied to packages, which are rectangular-shaped instead of square-shaped.

In yet another example, the material and the thickness of the metal leadframe can be selected as a function of the size of the chip so that specific product goals of the assembled package can be achieved such as final thickness, mechanical strength, minimum warpage, prevention of cracking, strong symbolization contrast, compatibility with pick-and-place machines, and minimum electrical parasitics. In addition, the starting metal of the plate may be roughened, or plated with metal layers (such as nickel, palladium, gold, and tin), to improve adhesion to polymeric compounds and solderablity to PCBs.

It is therefore intended that the appended claims encompass any such modifications or embodiments.

I claim:

1. An encapsulated semiconductor device package comprising:
   a metallic leadframe with a chip assembly pad;
   a semiconductor chip mounted on the chip assembly pad;
   an encapsulant encapsulating the leadframe and the semiconductor chip;
   a first pair of oblong metal pins exposed from a surface of the encapsulant, the pins straddling a corner of the package;
   each pin having a long axis, the long axes of the pair forming a non-orthogonal angle.

2. The package of claim 1 wherein the first pair of oblong pins is a pair of trapezoidal pins.

3. The package of claim 2 wherein each trapezoidal pin has a long side and a parallel short side, a third end side distal from the corner, and a fourth side forming an obtuse angle with the short side and an acute angle with the long side.

4. The package of claim 3 wherein the long sides of the pin pair are adjacent to each other.

5. The package of claim 4 wherein the chip assembly pad acting as thermal spreader.

6. The package of claim 5 wherein the third end sides of the first pin pair are adjacent to and parallel with an edge of the chip assembly pad.

7. The package of claim 6 further including a second pair of oblong metal pins straddling another corner.

8. The package of claim 7 further including two additional metal pins.

9. A plastic semiconductor device package comprising:
   a chip assembly pad;
   a semiconductor chip mounted on the chip assembly pad;
   plastic encapsulating the semiconductor chip and chip assembly pad;
   metal pins exposed from a surface of the plastic, the pins arrayed along opposite edges of the package, the package corners occupied by pins; and
   each pin having an axis and a mold lock protruding from the pin, the lock shaped as an elongated beam oriented normal to the axis, the beam interdigitated with a beam of an adjacent pin.

10. The package of claim 9 wherein the interdigitating beams extend across the center line of the space between adjacent pins.

11. The package of claim 10 wherein the metal pins include six pins.

12. The package of claim 11 wherein the chip assembly pad acting as thermal spreader.

* * * * *